(12) United States Patent
Shim et al.

(10) Patent No.: US 7,923,295 B2
(45) Date of Patent: Apr. 12, 2011

(54) SEMICONDUCTOR DEVICE AND METHOD OF FORMING THE DEVICE USING SACRIFICIAL CARRIER

(75) Inventors: Il Kwon Shim, Singapore (SG); Yaojian Lin, Singapore (SG); Seng Guan Chow, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 12/615,428

(22) Filed: Nov. 10, 2009

(65) Prior Publication Data

US 2010/0052135 A1    Mar. 4, 2010

Related U.S. Application Data

(63) Continuation of application No. 11/964,397, filed on Dec. 26, 2007, now abandoned.

(51) Int. Cl.
*H01L 21/00* (2006.01)

(52) U.S. Cl. ........ 438/109; 438/107; 438/108; 257/778; 257/700; 257/737; 257/738; 257/E23.175; 257/E23.169; 257/E23.151; 257/E23.142

(58) Field of Classification Search .................. 361/768, 361/738; 257/E23.061, E23.175, E23.169, 257/E23.151, E23.142, 778, 700, 723, 737, 257/738; 438/108, 107, 109
See application file for complete search history.

(56) References Cited

U.S. PATENT DOCUMENTS

| | | | |
|---|---|---|---|
| 5,250,843 A | 10/1993 | Eichelberger | |
| 5,353,498 A | 10/1994 | Fillion et al. | |
| 5,841,193 A | 11/1998 | Eichelberger | |
| 6,344,401 B1 | 2/2002 | Lam | |
| 6,396,153 B2 | 5/2002 | Fillion et al. | |
| 6,838,776 B2 | 1/2005 | Leal et al. | |
| 6,867,471 B2 | 3/2005 | Goller et al. | |
| 6,902,950 B2 | 6/2005 | Ma et al. | |
| 6,921,975 B2 | 7/2005 | Leal et al. | |
| 7,045,391 B2 | 5/2006 | Lin | |
| 7,619,901 B2 | 11/2009 | Eichelberger et al. | |
| 2004/0106288 A1 | 6/2004 | Igarashi et al. | |
| 2004/0262735 A1 | 12/2004 | Higashi et al. | |
| 2005/0184377 A1 | 8/2005 | Takeuchi et al. | |
| 2005/0287703 A1 | 12/2005 | Carney et al. | |
| 2006/0208356 A1 | 9/2006 | Yamano et al. | |
| 2008/0138935 A1 | 6/2008 | Pu et al. | |

*Primary Examiner* — Matthew S Smith
*Assistant Examiner* — Yu-Hsi Sun
(74) *Attorney, Agent, or Firm* — Robert D. Atkins; Patent Law Group

(57) ABSTRACT

A semiconductor device is made by forming a photoresist layer over a metal carrier. A plurality of openings is formed in the photoresist layer extending to the metal carrier. A conductive material is selectively plated in the openings of the photoresist layer using the metal carrier as an electroplating current path to form wettable contact pads. A semiconductor die has bumps formed on its surface. The bumps are directly mounted to the wettable contact pads to align the die with respect to the wettable contact pads. An encapsulant is deposited over the die. The metal carrier is removed. An interconnect structure is formed over the encapsulant and electrically connected to the wettable contact pads. A plurality of conductive vias is formed through the encapsulant and extends to the contact pads. The conductive vias are aligned by the wettable contact pads with respect to the die to reduce interconnect pitch.

14 Claims, 11 Drawing Sheets

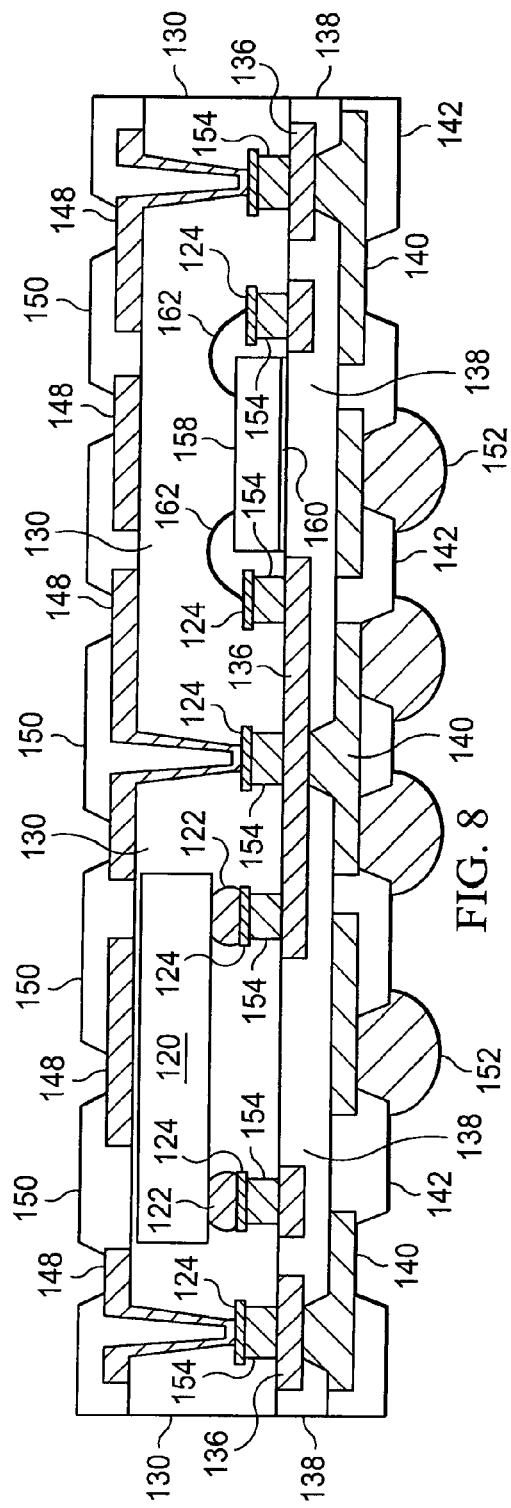
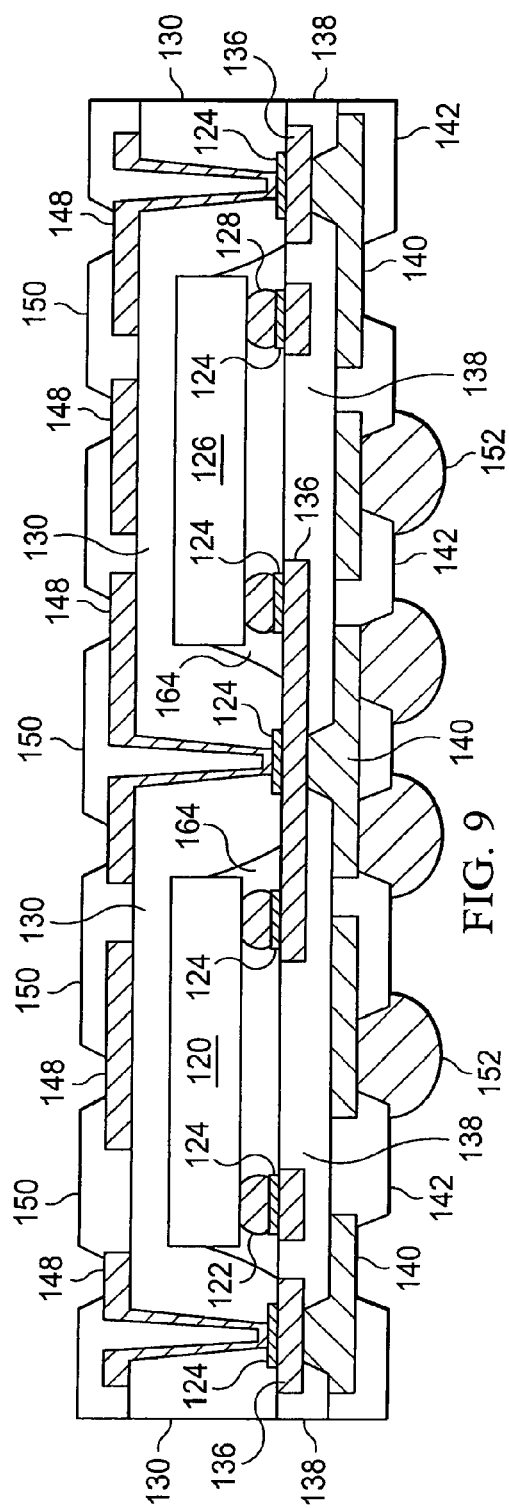
FIG. 8
FIG. 9

SEMICONDUCTOR DEVICE AND METHOD OF FORMING THE DEVICE USING SACRIFICIAL CARRIER

CLAIM TO DOMESTIC PRIORITY

The present application is a continuation of U.S. patent application Ser. No. 11/964,397, filed Dec. 26, 2007, and claims priority to the foregoing parent application pursuant to 35 U.S.C. §120.

FIELD OF THE INVENTION

The present invention relates in general to semiconductor devices and, more particularly, to a semiconductor device and method of forming the device using a sacrificial carrier.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die facedown toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

In many applications, it is desirable to stack WLCSPs. Appropriate electrical interconnect must be provided for complete device integration. The interconnect typically involves formation of redistribution layers (RDL) and other conductive lines and tracks. These metal lines have limited pitch and line spacing due to etching processing. The formation of the interconnect structure requires a high degree of alignment accuracy in attaching the die to the wafer carrier for subsequent encapsulation and further RDL buildup processes.

A need exists to form the interconnect structures for WLCSPs while accounting for the interconnect alignment requirements.

SUMMARY OF THE INVENTION

In one embodiment, the present invention is a method of making a semiconductor device comprising the steps of providing a metal carrier, forming a photoresist layer over the metal carrier, forming openings in the photoresist layer extending to the metal carrier, selectively electroplating a first conductive material in the openings of the photoresist layer using the metal carrier as an electroplating current path to form wettable contact pads, providing a first semiconductor die having a plurality of bumps formed on a surface of the first semiconductor die, mounting the bumps of the first semiconductor die directly to the wettable contact pads to align the first semiconductor die with respect to the wettable contact pads, depositing a first encapsulant over the first semiconductor die, removing the metal carrier, forming an interconnect structure over the first encapsulant and electrically connected to the wettable contact pads, forming vias through the first encapsulant over and extending to the wettable contact pads, and depositing a second conductive material in the vias. The second conductive material in the vias is aligned by the wettable contact pads with respect to the first semiconductor die to reduce interconnect pitch.

In another embodiment, the present invention is a method of making a semiconductor device comprising the steps of providing a metal carrier, and selectively electroplating conductive material over the metal carrier to form contact pads. The metal carrier provides an electroplating current path to form the contact pads on the metal carrier. The method further includes the steps of mounting a first semiconductor die or component to the contact pads to align the first semiconductor die or component with respect to the contact pads, depositing a first encapsulant over the first semiconductor die or component, and forming an interconnect structure over the first encapsulant and electrically connected to the contact pads.

In another embodiment, the present invention is a method of making a semiconductor device comprising the steps of providing a metal carrier, and selectively electroplating conductive material over the metal carrier to form contact pads. The metal carrier provides an electroplating current path to form the contact pads on the metal carrier. The method further includes the steps of mounting a first semiconductor die or component over the metal carrier aligned to the contact pads, depositing a first encapsulant over the first semiconductor die or component, and forming an interconnect structure over the first encapsulant and electrically connected to the contact pads.

In another embodiment, the present invention is a semiconductor device made by a process comprising the steps of providing a metal carrier, and selectively electroplating conductive material over the metal carrier to form contact pads. The metal carrier provides an electroplating current path to form the contact pads on the metal carrier. The process further includes the steps of mounting a first semiconductor die or component to the contact pads to align the first semiconductor die or component with respect to the contact pads, depositing a first encapsulant over the first semiconductor die or component, and forming an interconnect structure over the first encapsulant and electrically connected to the contact pads.

BRIEF DESCRIPTION OF THE DRAWINGS

FIG. 8 illustrates the semiconductor package with solder bump and wire bond interconnects to the die;

FIG. 9 illustrates the semiconductor package with underfill material disposed under the semiconductor die;

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
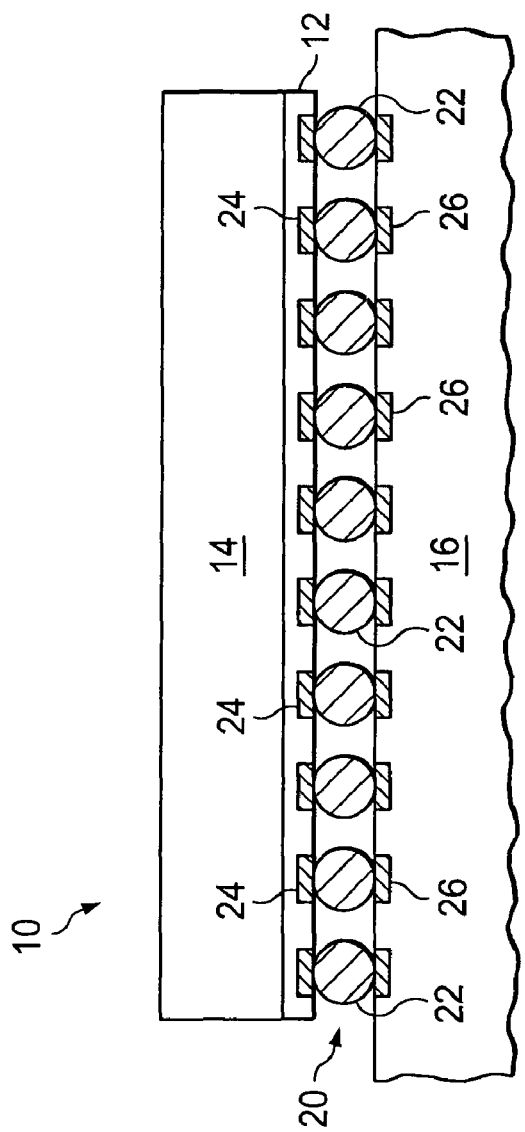
FIG. 1 is a flip chip semiconductor device with solder bumps providing electrical interconnect between an active area of the die and a chip carrier substrate.

Flip chip semiconductor packages and wafer level packages (WLP) are commonly used with integrated circuits (ICs) demanding high speed, high density, and greater pin count. Flip chip style semiconductor device 10 involves mounting an active area 12 of die 14 facedown toward a chip carrier substrate or printed circuit board (PCB) 16, as shown in FIG. 1. Active area 12 contains active and passive devices, conductive layers, and dielectric layers according to the electrical design of the die. Analog circuits may be created by the combination of one or more passive device formed within active area 12 and may be electrically interconnected. For example, an analog circuit may include one or more inductor, capacitor and resistor formed within active area 12. The electrical and mechanical interconnect is achieved through a solder bump structure 20 comprising a large number of individual conductive solder bumps or balls 22. The solder bumps are formed on bump pads or interconnect sites 24, which are disposed on active area 12. The bump pads 24 connect to the active circuits by conduction tracks in active area 12. The solder bumps 22 are electrically and mechanically connected to contact pads or interconnect sites 26 on carrier substrate 16 by a solder reflow process. The flip chip semiconductor device provides a short electrical conduction path from the active devices on die 14 to conduction tracks on carrier substrate 16 in order to reduce signal propagation, lower capacitance, and achieve overall better circuit performance.

Figure 2A:
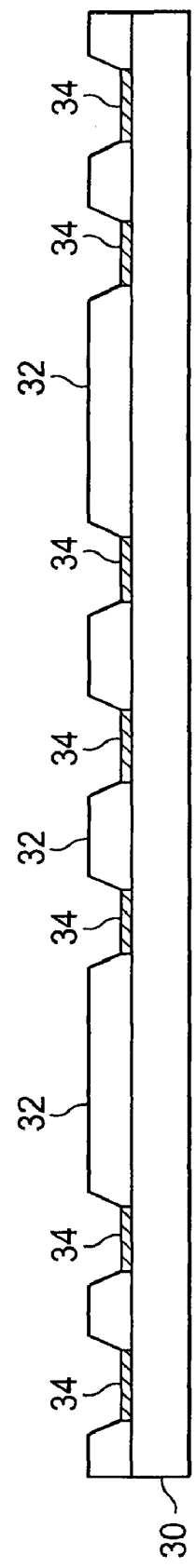
FIGS. 2a-2f illustrate formation of a semiconductor package using a sacrificial carrier.

Further detail of forming a semiconductor package in accordance with semiconductor device 10 is shown in FIGS. 2a-2f. In FIG. 2a, a dummy or sacrificial metal carrier 30 is shown. Metal carrier 30 is made with copper (Cu), aluminum (Al), or other stiff material. Carrier 30 can also be flexible tape. A photoresist layer 32 is deposited on metal carrier 30. A plurality of openings is formed by a photo patterning process to define areas for selective plating. Contact pads 34 are then selectively plated on photoresist defined opening areas. Contact pads 34 can be made with Cu, tin (Sn), nickel (Ni), gold (Au), or silver (Ag). Metal carrier 30 serves as a support member and plating current path for the electroplating process to form wettable metal contact pads 34 on the metal carrier. Part or all of photoresist 32 is removed by a resist stripper. Alternatively, a layer of photoresist 32 may remain between contact pads 34.

Figure 2B:
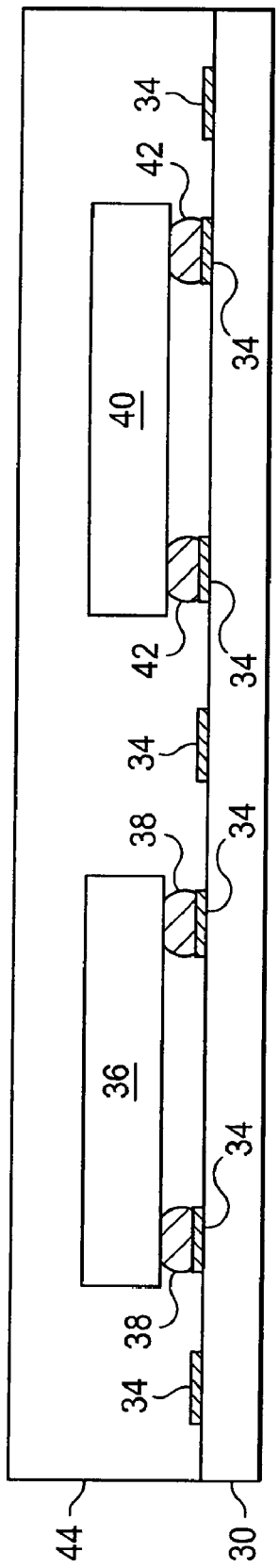
Figure 2C:
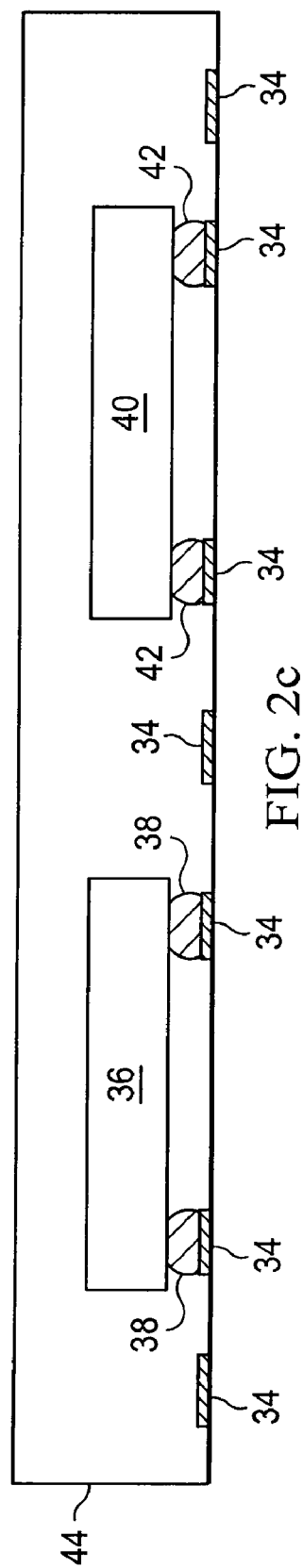

In FIG. 2b, semiconductor die 36 and 40 are mounted to contact pads 34 on metal carrier 30 with solder bumps 38 and 42, respectively. Alternatively, discrete components or other semiconductor packages can be mounted to contact pads 34. An optional underfill material can be formed below semiconductor die 36 and 40. A molding compound 44 is formed around semiconductor die 36 and 40 to encapsulate the die, interconnections, and contact pads. The metal carrier is removed by an etching process to expose contact pads 34 as shown in FIG. 2c.

Figure 2D:
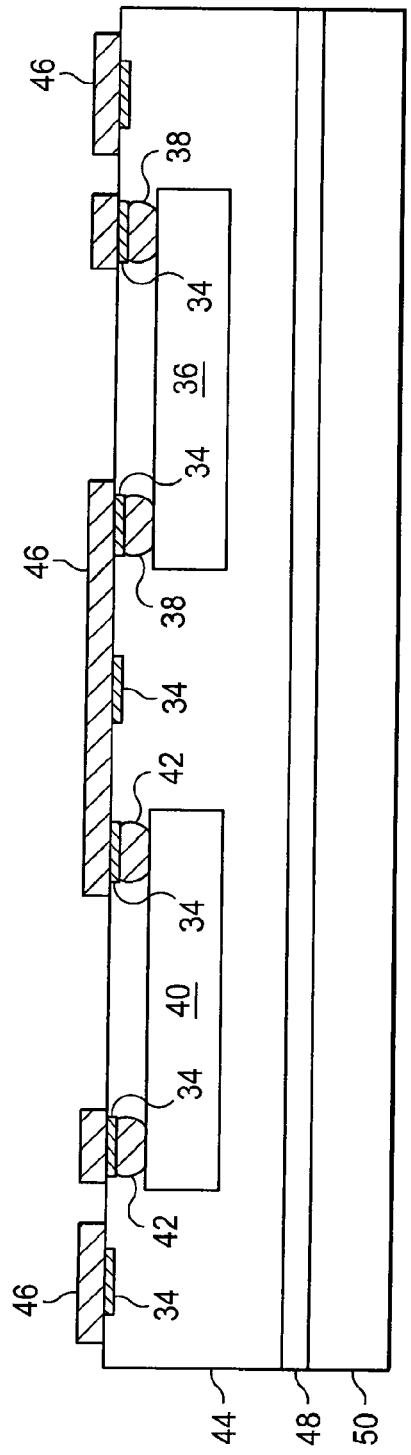

In FIG. 2d, the semiconductor die are inverted such that contact pads 34 face upward. An optional process carrier 50 is mounted to a backside of the semiconductor die using adhesive layer 48 to support the package. The adhesive layer can be made with thermally or ultraviolet (UV) light releasable temporary adhesive, typically having a glass transition temperature (Tg) of at least 150° C. A conductive layer 46 is sputtered and patterned, or selectively plated, on a surface of molded compound 44 using an adhesion layer, such as titanium (Ti). Conductive layer 46 is made with Cu, Al, Au, or alloys thereof. Conductive layer 46 electrically connects to contact pads 34 according to the electrical function and interconnect requirements of semiconductor die 36 and 40.

Figure 2E:
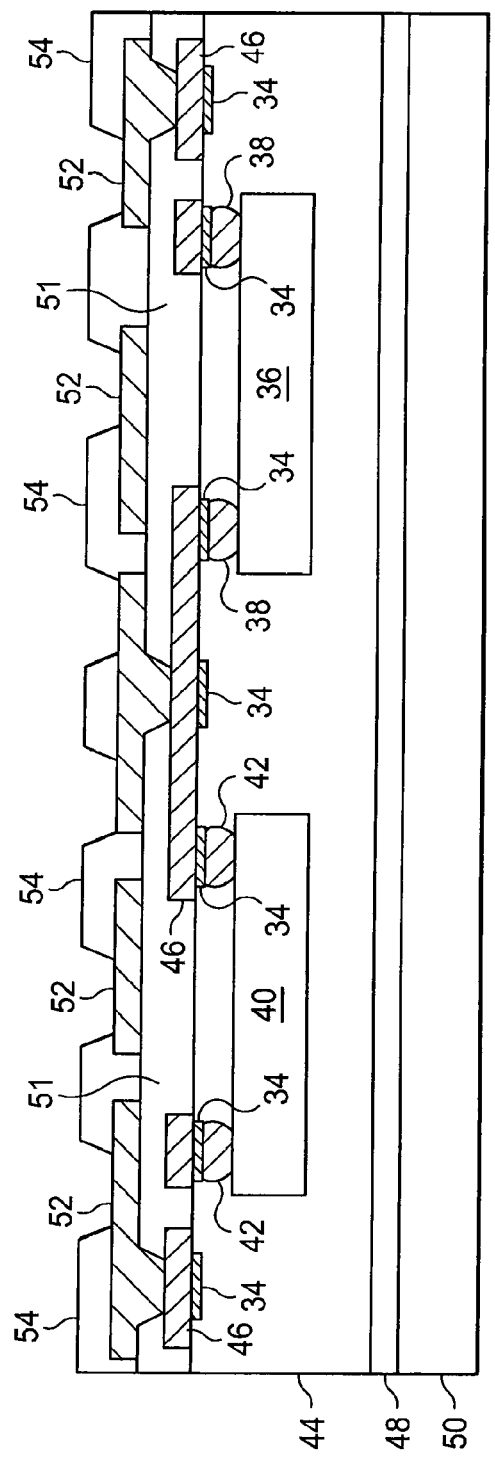

In FIG. 2e, an insulating layer 51 is formed over molding compound 44 and conductive layer 46. The insulating layer 51 can be made with single or multiple layers of photosensitive polymer material or other dielectric material having low cure temperature, e.g. less than 200° C. A portion of insulating layer 51 is removed by an etching process, such as photo patterning or chemical etching, to form openings and expose conductive layer 46. A conductive layer 52 is formed over insulating layer 51 to electrically contact conductive layer 46. An insulating layer 54 is formed over conductive layer 52 and insulating layer 51. The insulating layer 54 can be made with single or multiple layers of photosensitive polymer material or other dielectric material having low cure temperature, e.g. less than 200° C. A portion of insulating layer 54 is removed by an etching process, such as photo patterning or chemical etching, to form openings and expose conductive layer 52. Conductive layers 46 and 52 and insulating layers 51 and 54 constitute a portion of an interconnect structure which routes electrical signals between semiconductor die 36 and 40, as well as external to the package. Additional insulating layers and conductive layers can be used in the interconnect structure.

Figure 2F:
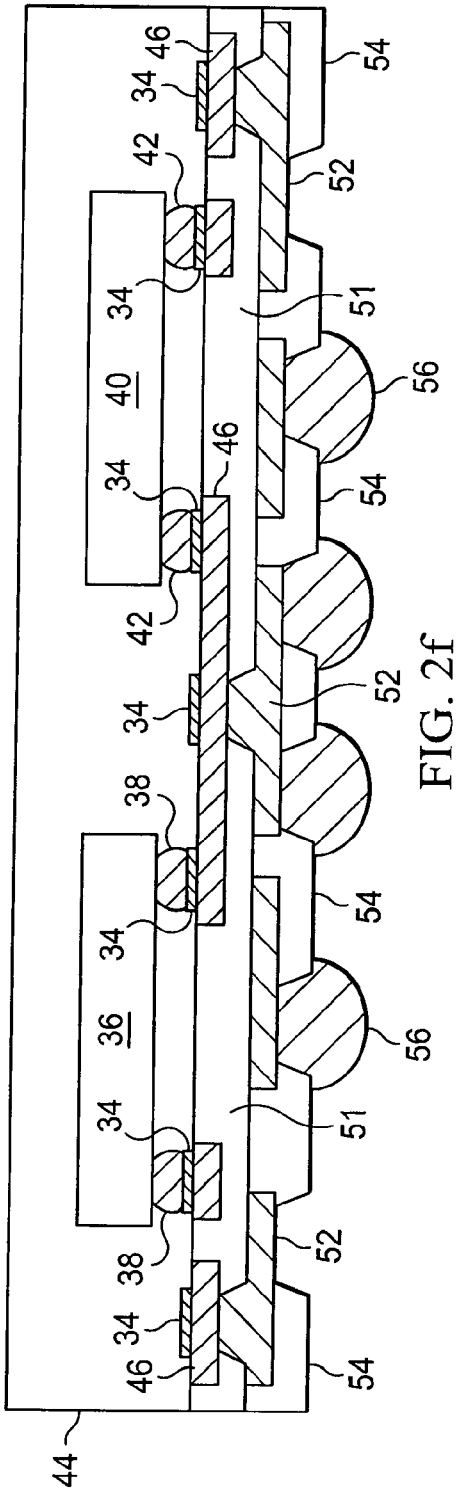

In FIG. 2f, an electrically conductive solder material is deposited over conductive layer 52 through an evaporation, electrolytic plating, electroless plating, ball drop, or screen printing process. The solder material can be any metal or electrically conductive material, e.g., Sn, lead (Pb), Ni, Au, Ag, Cu, bismuthinite (Bi) and alloys thereof. The solder material is reflowed by heating the conductive material above its melting point to form spherical balls or bumps 56. In some applications, solder bumps 56 are reflowed a second time to improve electrical contact to conductive layer 52. An additional under bump metallization can optionally be formed under solder bumps 56. The interconnections can be solder bumps or bond wires.

Process carrier 50 and adhesive layer 48 are removed. Alternatively, process carrier 50 and adhesive layer 48 can remain attached to the semiconductor device and operate as a heat sink for thermal dissipation or electromagnetic interference (EMI) barrier.

Figure 3:
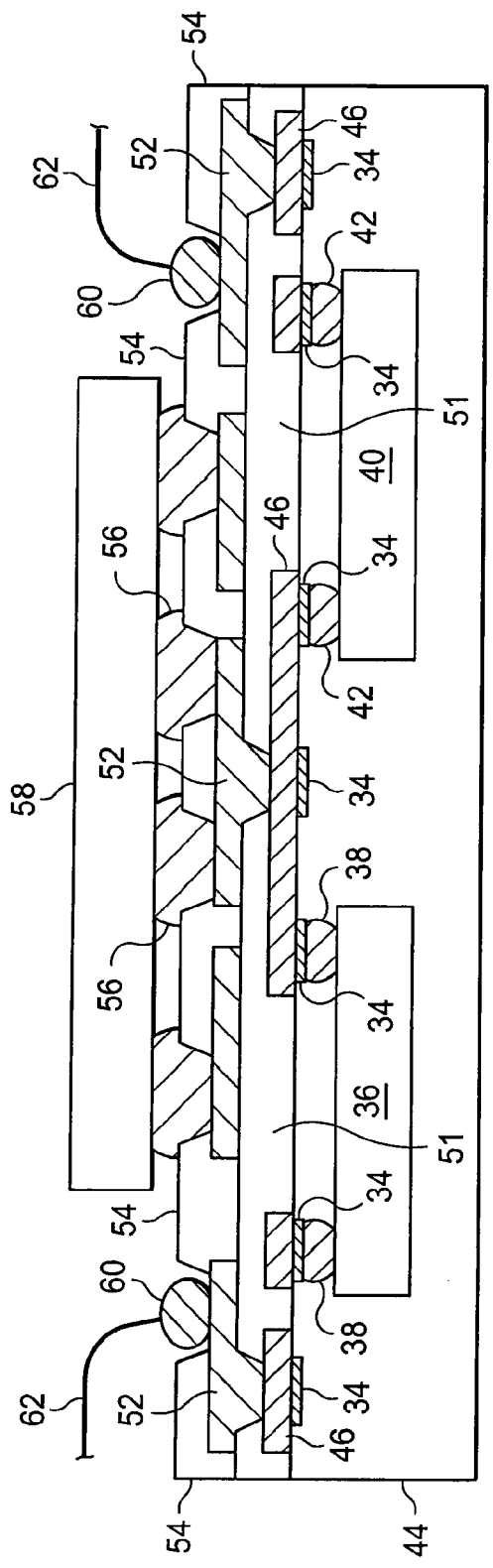
FIG. 3 illustrates the semiconductor package with solder bumps and wire bonds.

FIG. 3 illustrates the semiconductor device from FIGS. 2a-2f with semiconductor device 58 electrically connected to solder bumps 56. In addition, wire bonds 60 are electrically connected to conductive layer 52. Bond wires 62 extend from wire bonds 60 to other semiconductor devices or external electrical connections. Solder bumps 56 and bond wires 62 provide electrical interconnect for semiconductor die 36 and 40.

Figure 4A:
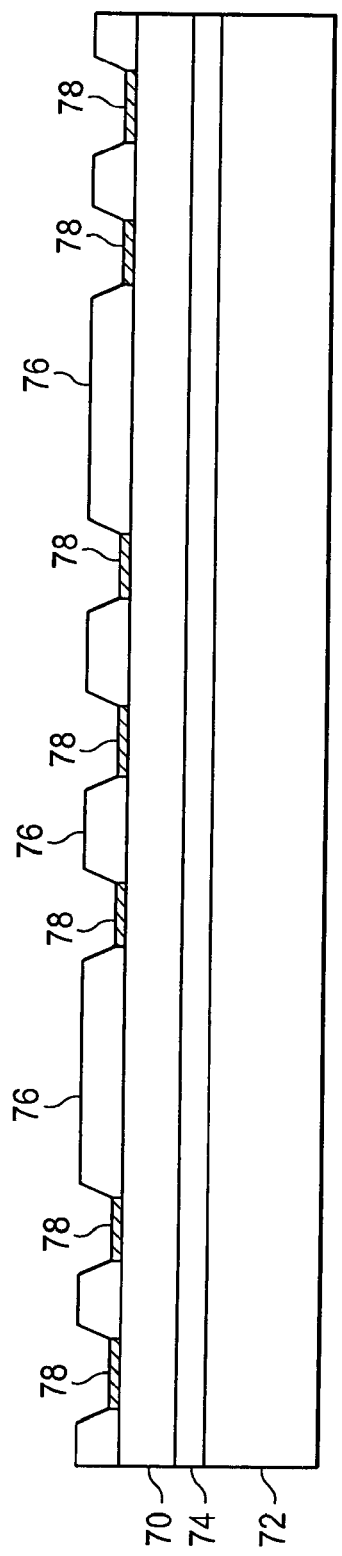
FIGS. 4a-4c illustrate an alternate formation of the semiconductor package with a sacrificial carrier.
Figure 4B:
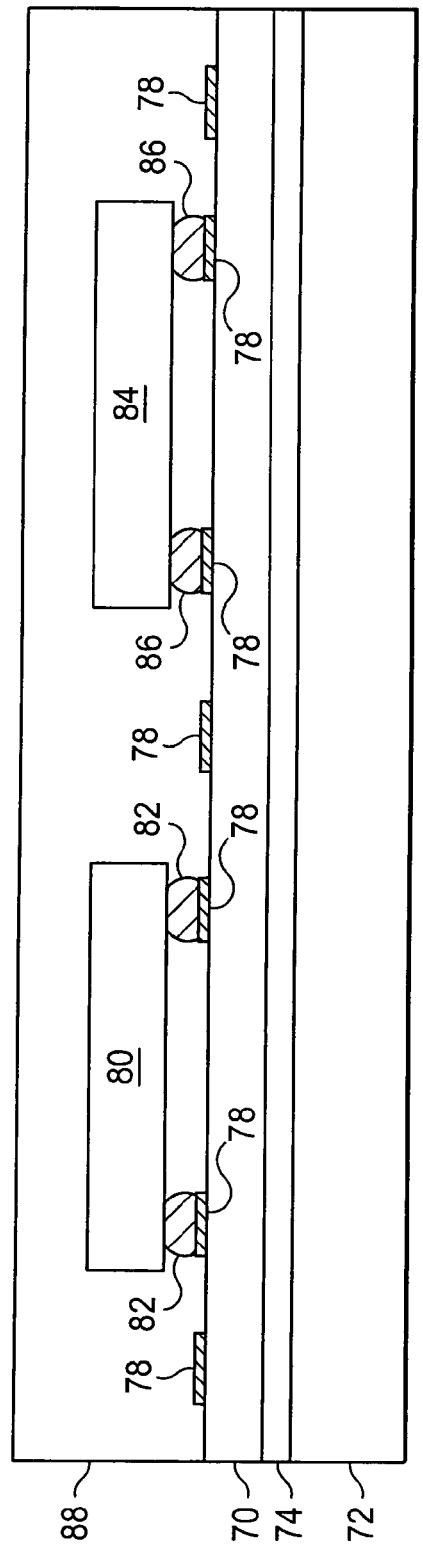
Figure 4C:
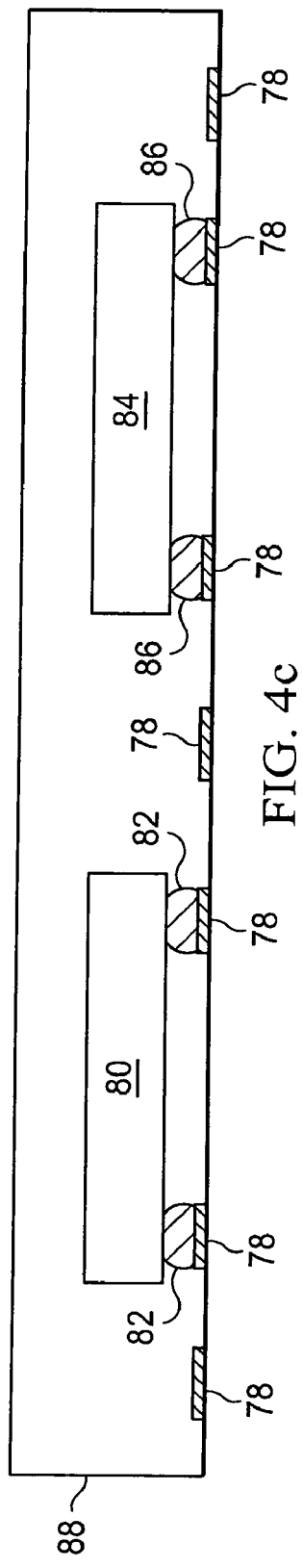

Another embodiment of the initial stages of making the semiconductor device is shown in FIGS. 4a-4c. In FIG. 4a, a dummy or sacrificial metal carrier 70 is shown. Metal carrier or foil 70 can be circular or rectangular and made with Cu or Al. A process carrier 72 is mounted to carrier 70 with adhesive layer 74. A photoresist layer 76 is deposited on metal carrier 70. A plurality of openings is formed by a photo patterning process to define areas for selective plating. Contact pads 78 are then selectively plated on photoresist defined opening areas. Contact pads 78 can be made with Cu, Sn, Ni, Au, or Ag. Metal carrier 70 serves as a support member and plating current path for the electroplating process to form wettable metal contact pads 78 on the metal carrier. Photoresist 76 is removed by a resist stripper.

In FIG. 4b, semiconductor die 80 and 84 are mounted to contact pads 78 on metal carrier 70 with solder bumps 82 and 86, respectively. Alternatively, discrete components or other semiconductor packages can be attached to contact pads 78. An optional underfill material can be formed below semiconductor die 80 and 84. A molding compound 88 is formed all around semiconductor die 80 and 84 to encapsulate the die, interconnections, and contact pads. Process carrier 72 and adhesive 74 are released first, followed by removal of metal carrier 70 by an etching process to expose contact pads 78 as shown in FIG. 4c.

The interconnect structure is then formed using the steps described in FIGS. 2d-2f. More specifically, a first conductive layer like 46 is sputtered and patterned, or selectively plated, on a surface of molded compound 88 using an adhesion layer, such as Ti. The first conductive layer electrically connects to contact pads 78 according to the electrical function and interconnect requirements of semiconductor die 80 and 84. A first insulating layer like 51 is formed over molding compound 88 and the first conductive layer. The first insulating layer can be made with single or multiple layers of photosensitive polymer material or other dielectric material having low cure temperature, e.g. less than 200° C. A portion of the first insulating layer is removed by an etching process to form openings and expose the first conductive layer. A second conductive layer like 52 is formed over the first insulating layer to electrically contact the first conductive layer. A second insulating layer like 54 is formed over the first conductive layer and first insulating layer. The second insulating layer can be made with single or multiple layers of photosensitive polymer material or other dielectric material having low cure temperature, e.g. less than 200° C. A portion of the second insulating layer is removed by an etching process to form openings and expose the second conductive layer. Solder bumps like 56 can be formed on the exposed second conductive layer. The first and second conductive layers and first and second insulating layers constitute a portion of an interconnect structure which routes electrical signals between semiconductor die 80 and 84, as well as external to the package. Additional insulating layers and conductive layers can be used in the interconnect structure.

Figure 5:
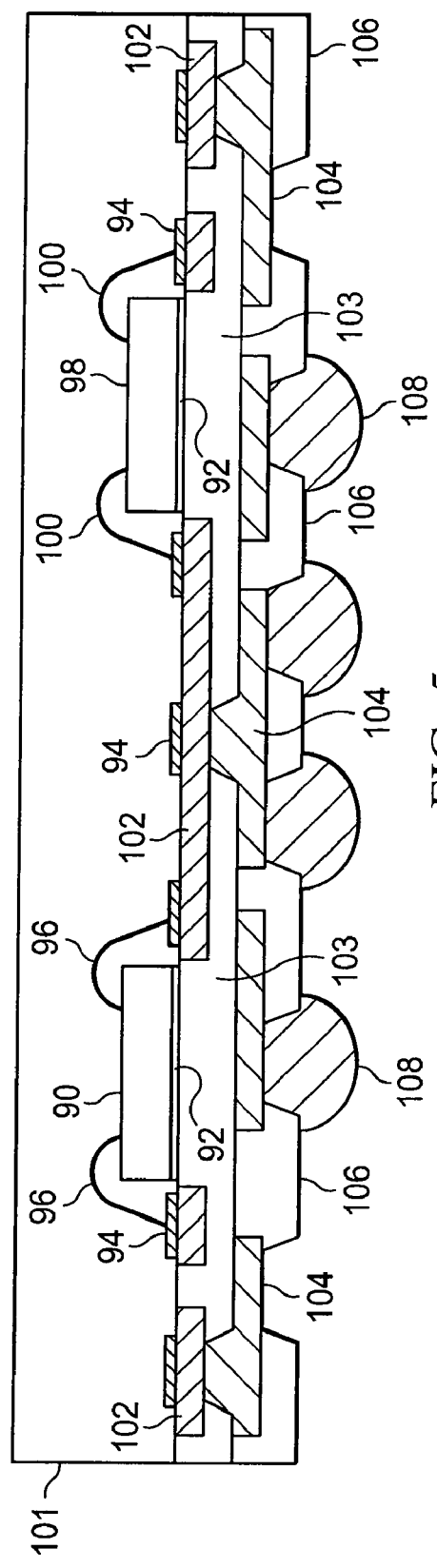
FIG. 5 illustrates the semiconductor package with wire bond interconnects to the semiconductor die.

FIG. 5 illustrates an embodiment of the semiconductor device. Contact pads 94 are formed using a dummy or sacrificial metal carrier as described in FIG. 2a. Semiconductor die 90 and 98 are mounted to contact pads 94 on the metal carrier with wire bonds 96 and 100, respectively. A molding compound 101 is formed all around semiconductor die 90 and 98 to encapsulate the die, wire bonds, and contact pads, similar to FIG. 2b. The metal carrier is removed by an etching process to expose contact pads 94, in the same manner as described in FIGS. 2c.

A process carrier is applied to a backside of the semiconductor die using an adhesive layer to support the package. A conductive layer 102 is selectively plated on a surface of molded compound 101 using an adhesion layer, such as Ti. Conductive layer 102 electrically connects to contact pads 94 according to the electrical function and interconnect requirements of semiconductor die 90 and 98.

An insulating layer 103 is formed over molding compound 101 and conductive layer 102. The insulating layer 103 can be made with material having dielectric properties. A portion of insulating layer 103 is removed by an etching process to form openings and expose conductive layer 102. A conductive layer 104 is formed over insulating layer 103 to electrically contact conductive layer 102. An insulating layer 106 is formed over conductive layer 104 and insulating layer 103. The insulating layer 106 can be made with material having dielectric properties. A portion of insulating layer 106 is removed by an etching process to form openings and expose conductive layer 104. Conductive layers 104 and 106 and insulating layers 103 and 106 constitute a portion of an interconnect structure to route electrical signals between semiconductor die 90 and 98 as well as external to the package. Additional insulating layers and conductive layers can be used in the interconnect structure.

An electrically conductive solder material is deposited over conductive layer 104 through an evaporation, electrolytic plating, electroless plating, ball drop, or screen printing process. The solder material can be any metal or electrically conductive material, e.g., Sn, Pb, Ni, Au, Ag, Cu, Bi, and alloys thereof. The solder material is ref lowed by heating the conductive material above its melting point to form spherical balls or bumps 108. In some applications, solder bumps 108 are ref lowed a second time to improve electrical contact to conductive layer 104. An additional under bump metallization can optionally be formed under solder bumps 108. The interconnections can be solder bumps or bond wires.

Figure 6A:
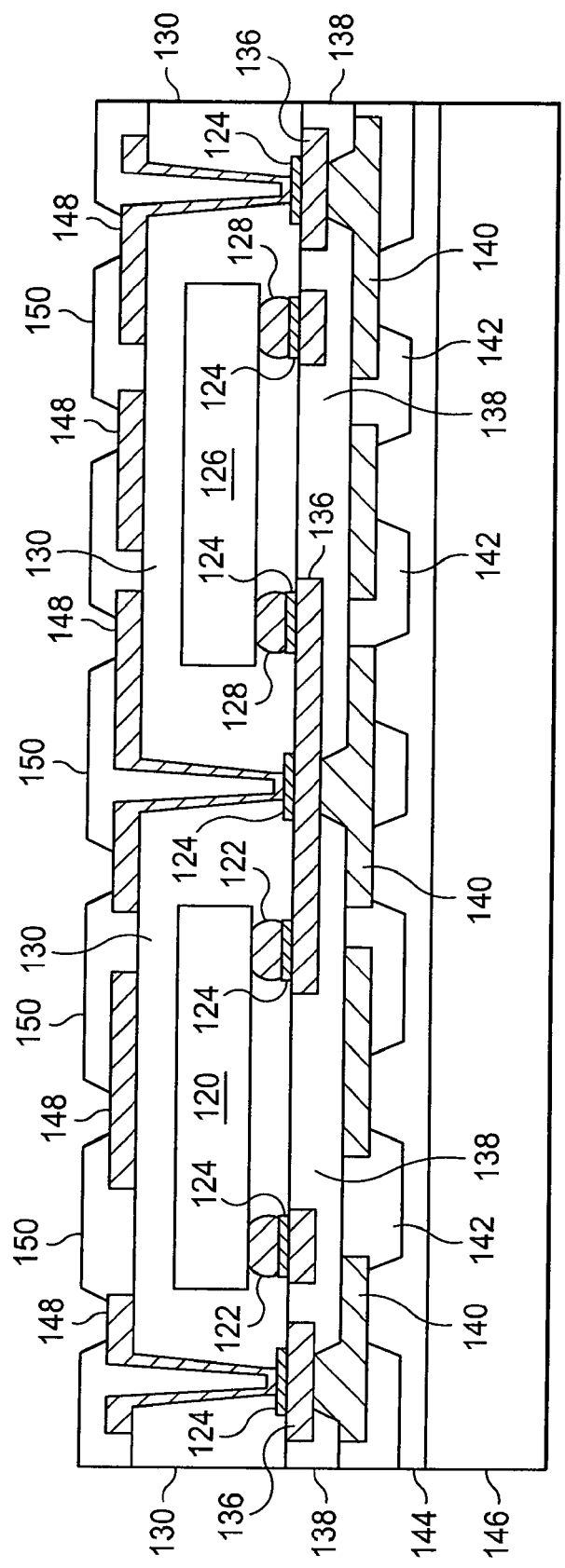
FIGS. 6a-6b illustrate the semiconductor package with front-side and backside interconnects.
Figure 6B:
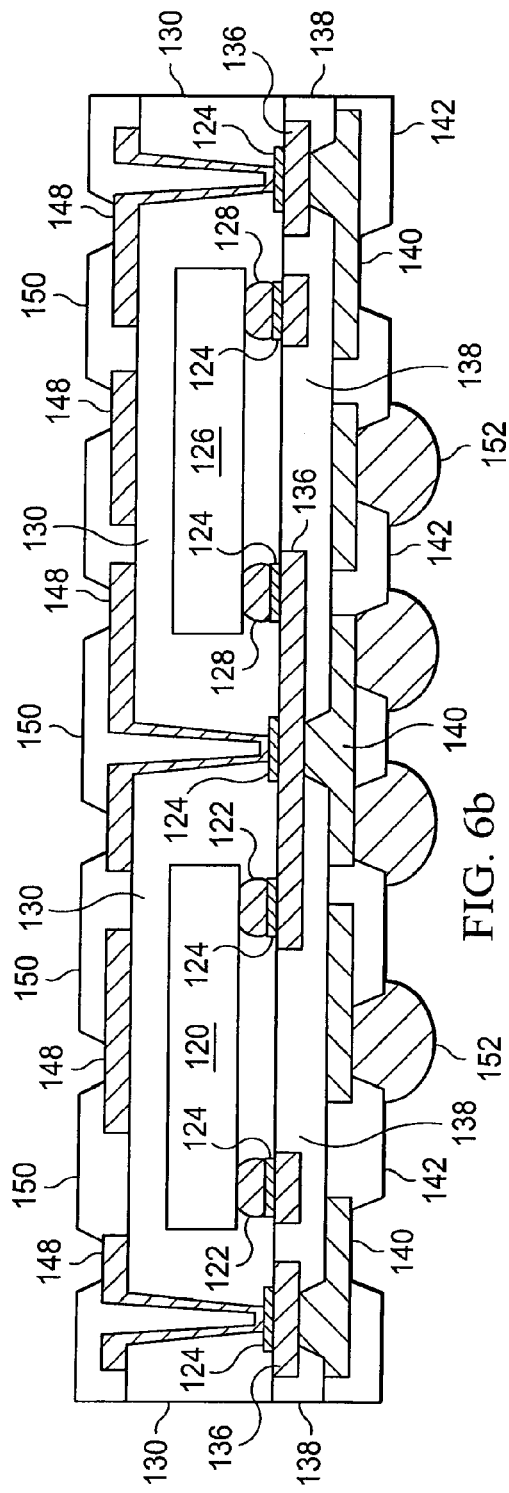

FIGS. 6a-6b illustrates an embodiment of the semiconductor device using a front-side and backside process carrier. In FIG. 6a, contact pads 124 are formed using a dummy or sacrificial metal carrier, as described in FIG. 2a. Semiconductor die 120 and 126 are mounted to contact pads 124 on the metal carrier with solder bumps 122 and 128, respectively. A molding compound 130 is formed around semiconductor die 120 and 126 to encapsulate the die, interconnect, and contact pads, similar to FIG. 2b. The metal carrier is removed by an etching process to expose contact pads 124, in the same manner as described in FIG. 2c.

A process carrier is applied to a backside of the semiconductor die using an adhesive layer to support the package. A conductive layer 136 is selectively plated on a surface of molded compound 130 using an adhesion layer, such as Ti. Conductive layer 136 electrically connects to contact pads 124 according to the electrical function and interconnect requirements of semiconductor die 120 and 126.

An insulating layer 138 is formed over molding compound 130 and conductive layer 136. The insulating layer 138 can be made with materials having dielectric properties. A portion of insulating layer 138 is removed by an etching process to form openings and expose conductive layer 136. A conductive layer 140 is formed over insulating layer 138 to electrically contact conductive layer 136. An insulating layer 142 is formed over conductive layer 140 and insulating layer 138. The insulating layer 142 can be made with material having dielectric properties. A portion of insulating layer 142 is removed by an etching process to form openings and expose conductive layer 140. Conductive layers 136 and 140 and insulating layers 138 and 142 constitute a portion of a front-side interconnect structure which routes electrical signals between semiconductor die 120 and 126, as well as external to the package. Additional insulating layers and conductive layers can be used in the front-side interconnect structure.

A front-side process carrier 146 is mounted to conductive layer 140 and insulating layer 142 using adhesive layer 144. The adhesive layer 144 can be made with thermally or UV light releasable temporary adhesive, typically having a Tg of at least 150° C. The front-side process carrier can be flexible tape or stiff material. The backside process carrier is removed. Vias are formed through molding compound 130 using laser drilling or deep reactive ion etch (DRIE). The vias expose contact pads 124. Conductive material 148 is deposited in the vias and electrically connects to contact pads 124. An insulating layer 150 is formed over conductive layer 148 and molding compound 130. The insulating layer 150 can be made with material having dielectric properties. A portion of insulating layer 150 is removed by an etching process to form openings and expose conductive layer 148. Conductive layer 148 and insulating layer 150 constitute a portion of a backside interconnect structure which routes electrical signals between semiconductor die 120 and 126, as well as external to the package. Additional insulating layers and conductive layers can be used in the backside interconnect structure.

In FIG. 6b, an electrically conductive solder material is deposited over conductive layer 140 through an evaporation, electrolytic plating, electroless plating, ball drop, or screen printing process. The solder material can be any metal or electrically conductive material, e.g., Sn, Pb, Ni, Au, Ag, Cu, Bi, and alloys thereof. The solder material is ref lowed by heating the conductive material above its melting point to form spherical balls or bumps 152. In some applications, solder bumps 152 are ref lowed a second time to improve electrical contact to conductive layer 140. An additional under bump metallization can optionally be formed under solder bumps 152. For the backside interconnects, solder bump or wire bond interconnects are formed on conductive layer 148 or the outermost layer.

Figure 7:
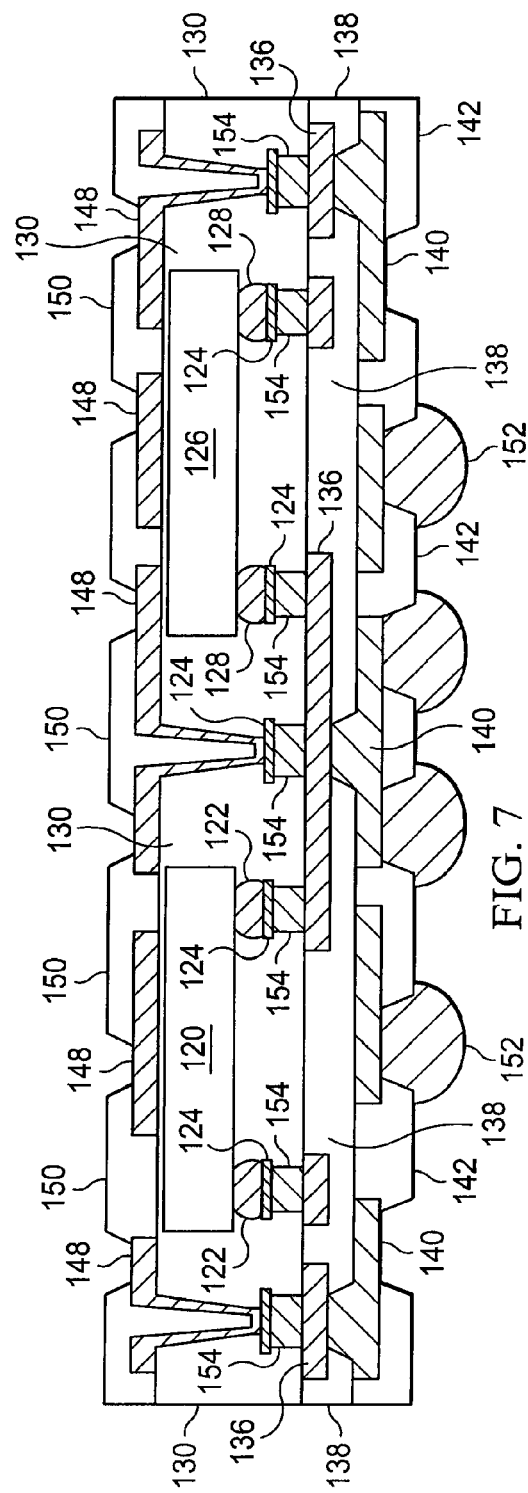
FIG. 7 illustrates the semiconductor package with pillars under the contact pads.

The semiconductor device in FIG. 7 follows a similar construction as described in FIGS. 6a-6b, with the exception that metal pillars 154 are formed by selective etching, using contact pads 124 as etching mask. Pillars 154 are made with Cu, Al, or alloys thereof. Metal pillars 154 facilitate depositing molded underfill material below semiconductor die 120 and 126 due to the elevated interconnect structure. Metal pillars 154 further facilitate the formation of vias by laser drilling or DRIE process as the via depth can be reduced. The semiconductor device experiences less thermal stress or thermal strain with the higher interconnection structure.

FIG. 8 shows the semiconductor device of FIG. 7 with contact pads 124 and semiconductor die 120 elevated by metal pillars 154. Semiconductor die 158 is mounted to insulating layer 138 with die attach adhesive 160 and electrically connected to contact pads 124 and metal pillars 154 with wire bonds 162. The die attach adhesive 160 can be made with epoxy based or film based adhesive.

In FIG. 9, the semiconductor device of FIG. 6b has underfill material 164. The underfill material can be made with resin having proper rheological and dielectric properties.

Figure 10:
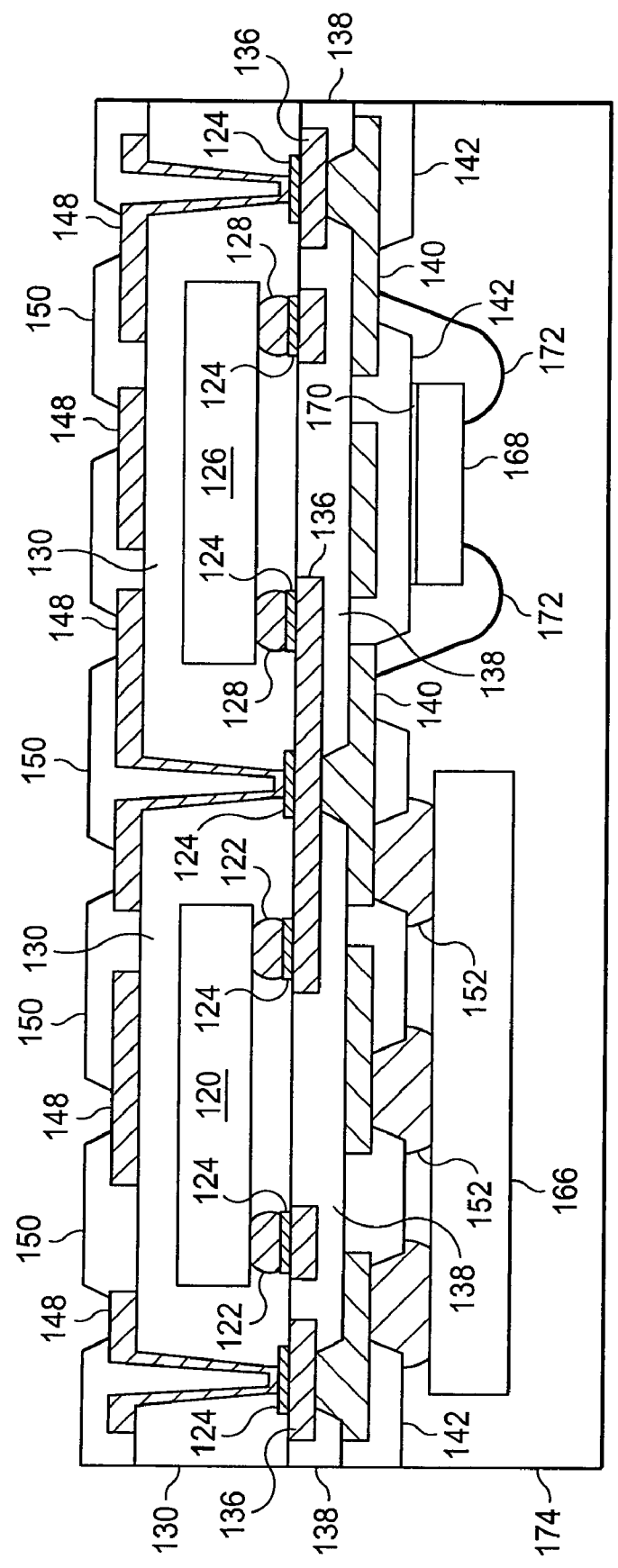
FIG. 10 illustrates the semiconductor package with secondary die mounted to the front-side interconnects.

In FIG. 10, the semiconductor device of FIG. 6b has semiconductor die 166 physically mounted to and electrically connected through solder bumps 152. Semiconductor die 168 is physically mounted to insulating layer 142 with die attach material 170 and electrically connected to conductive layer 140 with wire bonds 172. A molding compound 174 is applied over semiconductor die 166 and 168 and associated interconnect structures.

Figure 11:
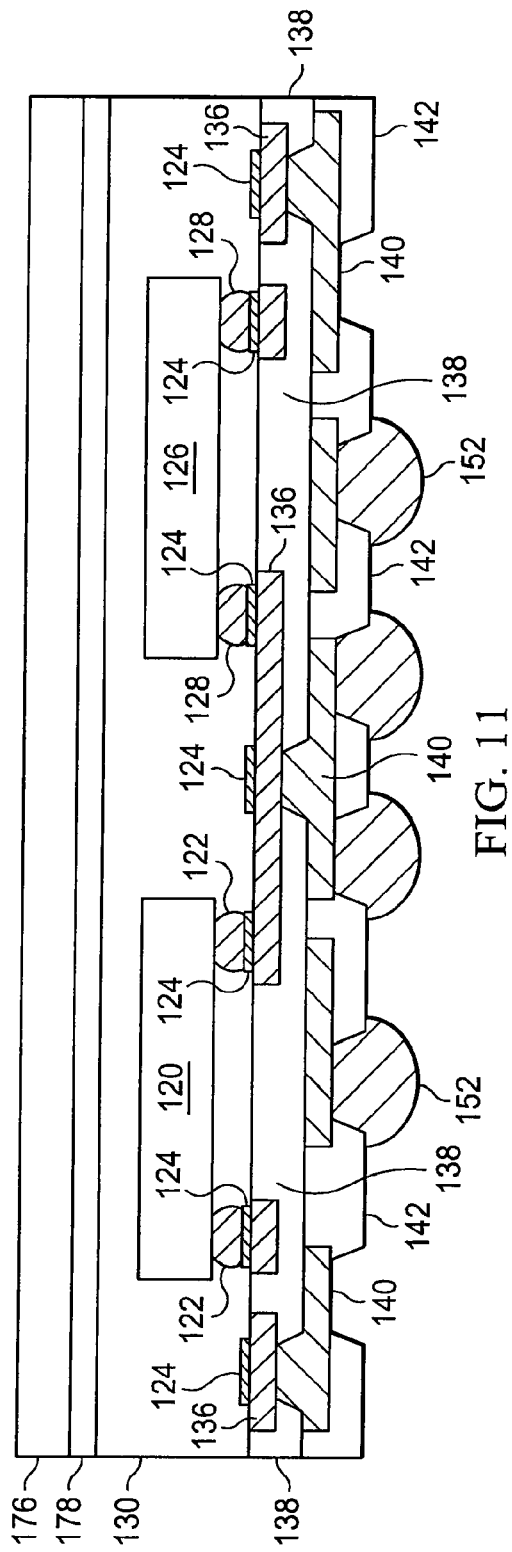
FIG. 11 illustrates the semiconductor package with the sacrificial carrier left intact for heat dissipation.

FIG. 11 shows the semiconductor device of FIG. 2f with process carrier 176 and adhesive layer 178 remaining as a heat sink for thermal dissipation or EMI shield.

Figure 12:
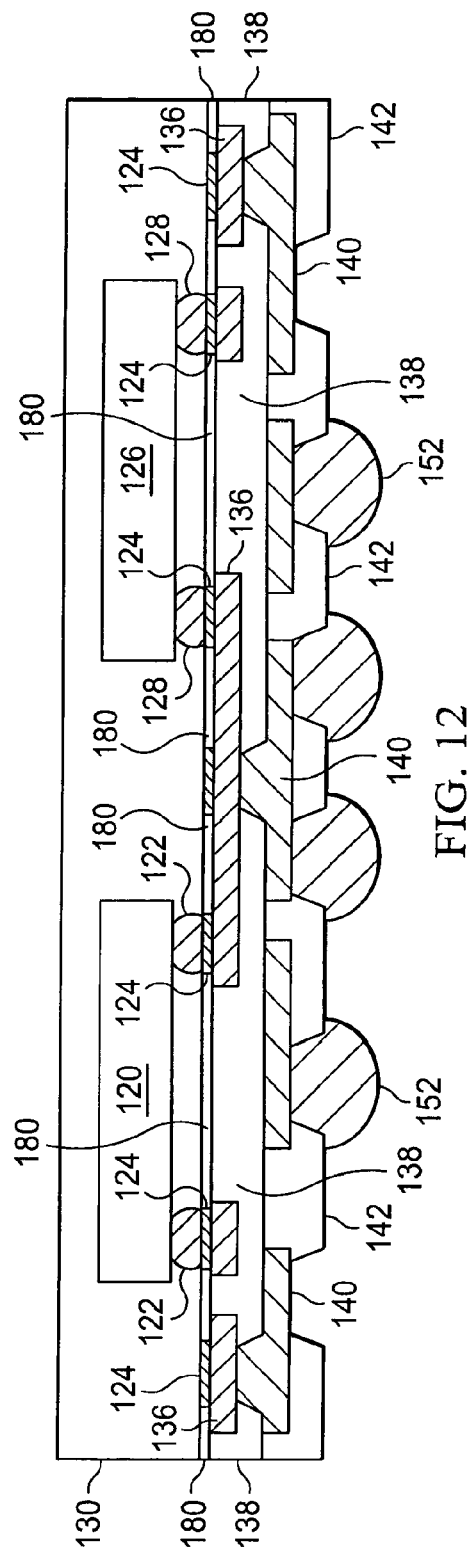
FIG. 12 illustrates the semiconductor package with photoresist left intact between the contact pads.

FIG. 12 shows the semiconductor device of FIG. 2f with a layer of photoresist 180 remaining between contact pads 124.

In summary, the semiconductor device employs a copper sheet as a dummy or sacrificial carrier. A plurality of wettable contact pads is patterned on the sacrificial carrier. The individual semiconductor die are mounted to the sacrificial carrier and are electrically connected to the contact pads. The semiconductor die and contact pads are encapsulated with a molding compound. The sacrificial carrier is removed to expose the metal pads. An interconnect build-up layer is formed on the contact pads. The wettable contact pads are selectively plated on the sacrificial metal carrier to provide a highly accurate alignment of the bonding pad positions for the electrical interconnect according to the electrical function of the semiconductor die. By forming contact pads on the sacrificial carrier, a precise placement and alignment for the later formed requisite interconnect structure can be achieved.

Accordingly, the semiconductor package has greater interconnect density and lower line pitch for individual traces.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a metal carrier;
    forming a photoresist layer over the metal carrier;
    forming openings in the photoresist layer extending to the metal carrier;
    selectively electroplating a first conductive material in the openings of the photoresist layer using the metal carrier as an electroplating current path to form wettable contact pads;
    mounting a first semiconductor die directly to the wettable contact pads with a plurality of bumps to align the first semiconductor die with respect to the wettable contact pads;
    depositing a first encapsulant over the first semiconductor die;
    removing the metal carrier;
    forming an interconnect structure over the first encapsulant and electrically connected to the wettable contact pads;
    forming vias through the first encapsulant over and extending to the wettable contact pads; and
    depositing a second conductive material in the vias, the second conductive material in the vias being aligned by the wettable contact pads with respect to the first semiconductor die to reduce interconnect pitch.

2. The method of claim 1, wherein forming the interconnect structure includes:
    forming a conductive layer electrically connected to the wettable contact pads;
    forming an insulating layer over the conductive layer; and
    removing a portion of the insulating layer to expose the conductive layer.

3. The method of claim 1, further including forming an insulating layer over the conductive material in the vias.

4. The method of claim 1, wherein the first conductive material includes tin.

5. The method of claim 1, further including forming a conductive pillar under the wettable contact pads.

6. The method of claim 1, further including:
    mounting a second semiconductor die over the interconnect structure; and
    depositing a second encapsulant over the second semiconductor die and interconnect structure.

7. The method of claim 1, wherein the wettable contact pads are separated with the photoresist layer.

8. A method of making a semiconductor device, comprising:
    providing a metal carrier;
    forming a photoresist layer over the metal carrier;
    forming openings in the photoresist layer extending to the metal carrier;
    selectively electroplating a conductive material over the metal carrier and in the openings of the photoresist layer using the metal carrier as an electroplating current path to form contact pads on the metal carrier;
    mounting a first semiconductor die or component directly to the contact pads with a plurality of bumps to align the first semiconductor die or component with respect to the contact pads;
    depositing a first encapsulant over the first semiconductor die or component; and
    forming an interconnect structure over the first encapsulant and electrically connected to the contact pads.

9. The method of claim 8, further including forming conductive vias through the first encapsulant and extending to the contact pads, the conductive vias being aligned by the contact pads with respect to the first semiconductor die or component to reduce interconnect pitch.

10. The method of claim 9, further including forming an insulating layer over the conductive vias.

11. The method of claim 8, wherein forming the interconnect structure includes:
    forming a conductive layer electrically connected to the contact pads;
    forming an insulating layer over the conductive layer; and
    removing a portion of the insulating layer to expose the conductive layer.

12. The method of claim 8, further including forming a conductive pillar under the contact pads.

13. The method of claim 8, further including:
    mounting a second semiconductor die or component over the interconnect structure; and
    depositing a second encapsulant over the second semiconductor die or component and interconnect structure.

14. The method of claim 8, wherein the contact pads are separated with the photoresist layer.

* * * * *